US006556612B2

United States Patent
Ershov et al.

(10) Patent No.: US 6,556,612 B2
(45) Date of Patent: *Apr. 29, 2003

(54) LINE NARROWED LASER WITH SPATIAL FILTER

(75) Inventors: Alexander I. Ershov, San Diego, CA (US); Igor V. Fomenkov, San Diego, CA (US)

(73) Assignee: Cymer, Inc., San Diego, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,478

(22) Filed: May 10, 1999

(65) Prior Publication Data

US 2002/0034209 A1 Mar. 21, 2002

(51) Int. Cl.7 .................................................. H01S 3/08
(52) U.S. Cl. ......................... 372/103; 372/108; 372/33; 372/27
(58) Field of Search ............................... 372/19–20, 57, 372/33, 92, 98, 100, 102–103, 9, 22, 27, 37, 108; 356/450

(56) References Cited

U.S. PATENT DOCUMENTS

| 4,549,144 A | * 10/1985 | Summers ..................... 372/94 |
| 4,649,544 A | * 3/1987 | Haas et al. ................... 372/105 |
| 5,050,174 A | * 9/1991 | Wani et al. .................... 732/20 |
| 5,192,982 A | * 3/1993 | Lapucci ....................... 356/450 |
| 5,298,971 A | * 3/1994 | Huang et al. ................. 356/353 |
| 5,386,426 A | * 1/1995 | Stephens ..................... 732/102 |
| 5,504,763 A | * 4/1996 | Bischel et al. ................. 372/33 |
| 5,835,520 A | 11/1998 | Das et al. ...................... 372/57 |
| 5,856,991 A | 1/1999 | Ershov ......................... 372/57 |
| 6,101,211 A | 8/2000 | Wakabayashi et al. ....... 372/102 |
| 6,137,821 A | * 10/2000 | Ershov ......................... 372/108 |
| 6,181,724 B1 | * 1/2001 | Tanaka et al. ................. 372/57 |

FOREIGN PATENT DOCUMENTS

| DE | 295 957 A5 | 10/1983 | ........... H01S/3/098 |
| EP | 0 820 132 A2 | 1/1998 | ......... H01S/3/0975 |
| JP | 03250776 | 11/1991 | ......... H01S/3/1055 |
| JP | 05152666 | 6/1993 | ......... H01S/3/1055 |
| JP | 01225186 | 9/1998 | ........... H01S/3/098 |
| WO | WO 96/31929 | 10/1996 | ......... H01S/3/1055 |

* cited by examiner

Primary Examiner—Michael P. Stafira
Assistant Examiner—Sang H. Nguyen
(74) Attorney, Agent, or Firm—John R. Ross

(57) ABSTRACT

A line narrowed laser system having a spatial filter to filter light at wavelengths greater and/or smaller than a desired range of wavelengths. The laser system is line narrowed with a line narrowing mechanism having a dispersive element which disperses laser light into wavelength dependent directions. By spatially filtering the resulting beam the bandwidth of the beam can be reduced substantially. There is also a reduction of beam energy as a result of the spatial filtering but this reduction is substantially less than some other known techniques for reducing bandwidths. A preferred spatial filter, for reducing the bandwidth of a line narrowed gas discharge laser, includes two cylindrical mirrors separated by a distance equal to their focal lengths with a slit aperture positioned at the common focal line.

12 Claims, 9 Drawing Sheets

LINE NARROWED LASER WITH SPATIAL FILTER

This invention relates to lasers and in particular to line narrowed lasers.

BACKGROUND OF THE INVENTION

An important use of electric discharge lasers such as excimer lasers is as a light source for integrated circuit lithography. State of the art KrF and ArF excimer lasers have a natural bandwidth of about 300 pm. Line narrowing systems currently in use reduce this natural bandwidth to about 0.8 pm (FWHM) and about 3 pm (95% integral) for the KrF laser with similar reductions for the ArF laser. Such a prior art system is shown in FIG. 1. In this system, beam 18 is generated in laser chamber 3. The resonance cavity is defined by output coupler 4 (which typically is a partially reflecting mirror) and line narrowing module 6 comprised of a three prism (8, 10 and 12) beam expander, tuning mirror 14 and grating 16 arranged in a Littrow configuration. The wavelength of the beam is monitored by wavemeter 24 which provides a signal for controlling the pivot position of mirror 14 to adjust the wavelength. Wavemeter 24 typically also comprises spectrometer instruments for measuring the bandwidth of the output beam. In some embodiments equipment can be added to the grating to adjust its curvature to improve the bandwidth.

U.S. Pat. No. 5,835,520 assigned to Applicant's employer teaches a method of bandwidth reduction by reducing the concentration of fluorine in the gas mixture and by correspondingly by increasing the reflectivity of the output coupler to compensate for reduced efficiency of the laser.

U.S. Pat. No. 5,856,991 assigned to Applicant's employer teaches the method of bandwidth reduction by using a line-narrowing etalon output coupler 26 as shown in FIG. 2. This etalon output coupler provides additional spectral selection when its maximum is tuned to the line-narrowing package maximum reflectivity wavelength. This tuning is done by driver 34, controlled by control module 30. This technique is very effective in reducing the bandwidth of the laser, especially 95% integral bandwidth, but it does add complexity and significant cost for the cost of extra parts. Also, tuning of the etalon increases operational complexity.

A known technique for reducing the bandwidth of an output beam of a FIG. 1 laser is to aperture the output beam.

What is needed is the system which can provide additional bandwidth reduction without added complexity of U.S. Pat. No. 5,856,991.

SUMMARY OF THE INVENTION

The present invention provides a line narrowed laser system having a spatial filter to filter light at wavelengths greater and/or smaller than a desired range of wavelengths. The laser system is line narrowed with a line narrowing optics including a dispersive element which disperses laser light into wavelength dependent directions. By spatially filtering the resulting beam the bandwidth of the beam can be reduced substantially. There is also a reduction of beam energy as a result of the spatial filtering but this reduction is substantially less than some other known techniques for reducing bandwidths. A preferred spatial filter, for reducing the bandwidth of a line narrowed gas discharge laser, includes two cylindrical mirrors separated by a distance equal to their focal lengths with a slit aperture positioned at the common focal line.

The spatial filtering technique of the present invention is a low cost technique, relatively easy to implement and does not significantly complicate laser operation as compared to some more elaborate systems for reducing laser bandwidth.

DETAILED DESCRIPTION OF THE PREFERRED EMBODIMENTS

First Preferred Embodiment

Figure 3:
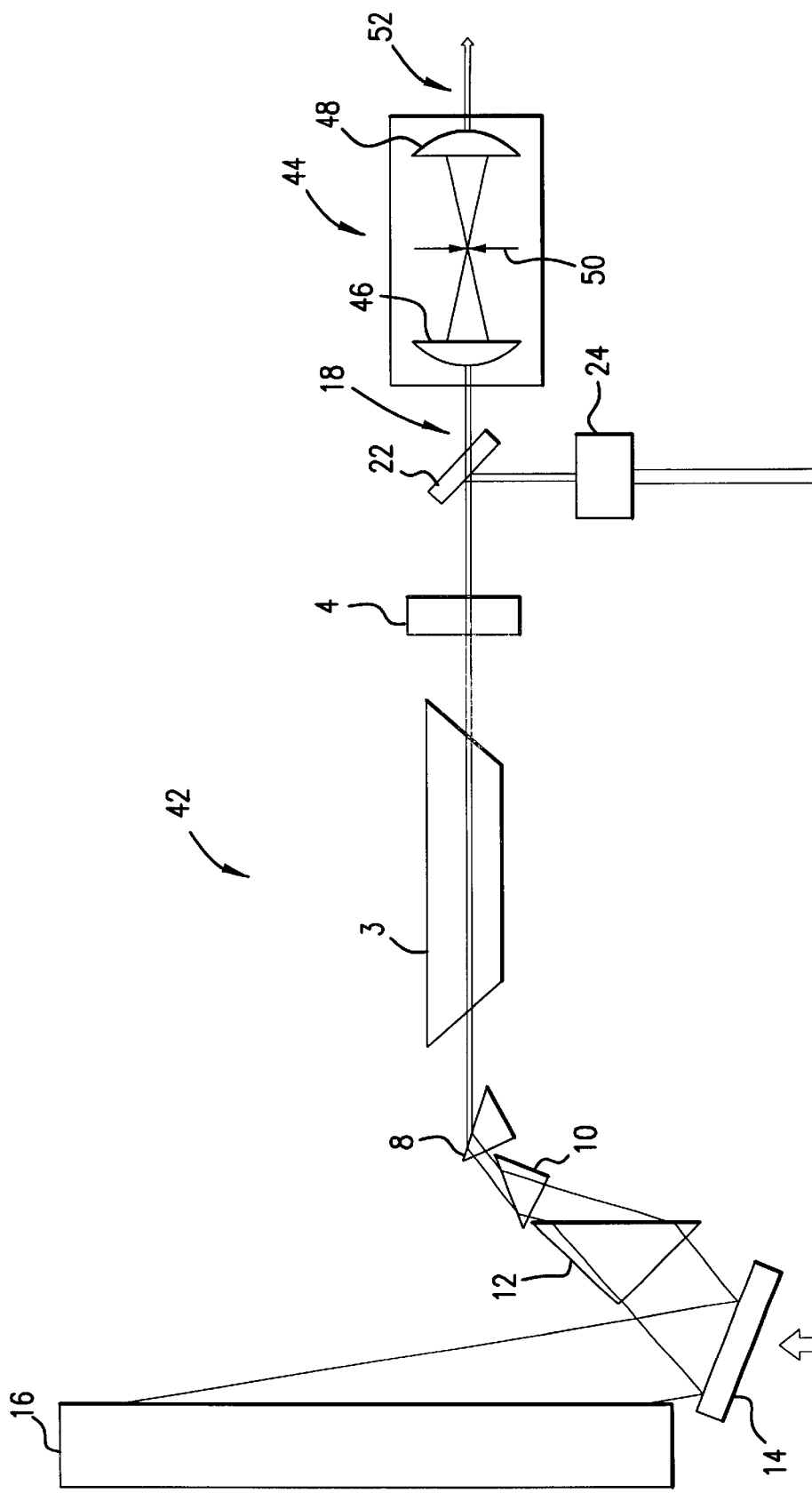
FIG. 3 shows a first preferred embodiment of a narrow band excimer laser of the present invention.

A first embodiment of the present invention is shown in FIG. 3. The excimer laser of this embodiment has similar line narrowing optics (including a diffraction grating) as the prior art excimer laser of FIG. 1. But in this preferred embodiment, the output beam 18 is sent through a spatial filter 44 after passing through output coupler 4. The spatial filter 44 consists of two cylindrical focusing lenses 46 and 48 separated by a distance equal to the sum of the focal lengths of both lenses. The lenses have a focal length of about 20 cm and the cylinder axis is oriented in vertical direction (in and out of the plane of drawing) which is in this embodiment also the discharge direction of the laser. The first lens focuses the laser beam in horizontal direction but does not focus the beam in vertical direction. As a result, the beam will be focused to a vertical line approximately midway between the lenses. In this location an aperture 50 is positioned. This aperture is a vertical slit whose position can be adjusted both along the beam propagation direction and across it by an X–Y adjustable mount (not shown). The width of the slit is preferably between 100 microns and 200 microns. The length of the slit in this embodiment is just slightly larger than the electrode gap, i.e., about 20 mm. Therefore, this aperture will transmit the beam originally propagating within an angle of 0.5 to 1.0 mrad in horizontal direction. (The 1.0 mrad, corresponds to a slit of 200 microns and a focal length of 200,000 microns.) This beam is then recollimated with a lens 48. (If lenses 46 and 48 with larger focal lengths are used, the distance between the lenses and the width of the slit 50 should be increased proportionally.) This can be done to reduce the power density on the slit 50 and increase its lifetime. Also, the lenses with different focal lengths can be used, with the position of the aperture 50 shifted proportionally to the lens with shorter focal length. As it will be explained below, this spatial filter not only filters out divergence of the laser beam, which is well known use of it, but it also helps to farther reduce the bandwidth of the laser. Therefore, beam 52 exiting the spatial filter 44 will have a narrowed spectral width.

Figure 1:
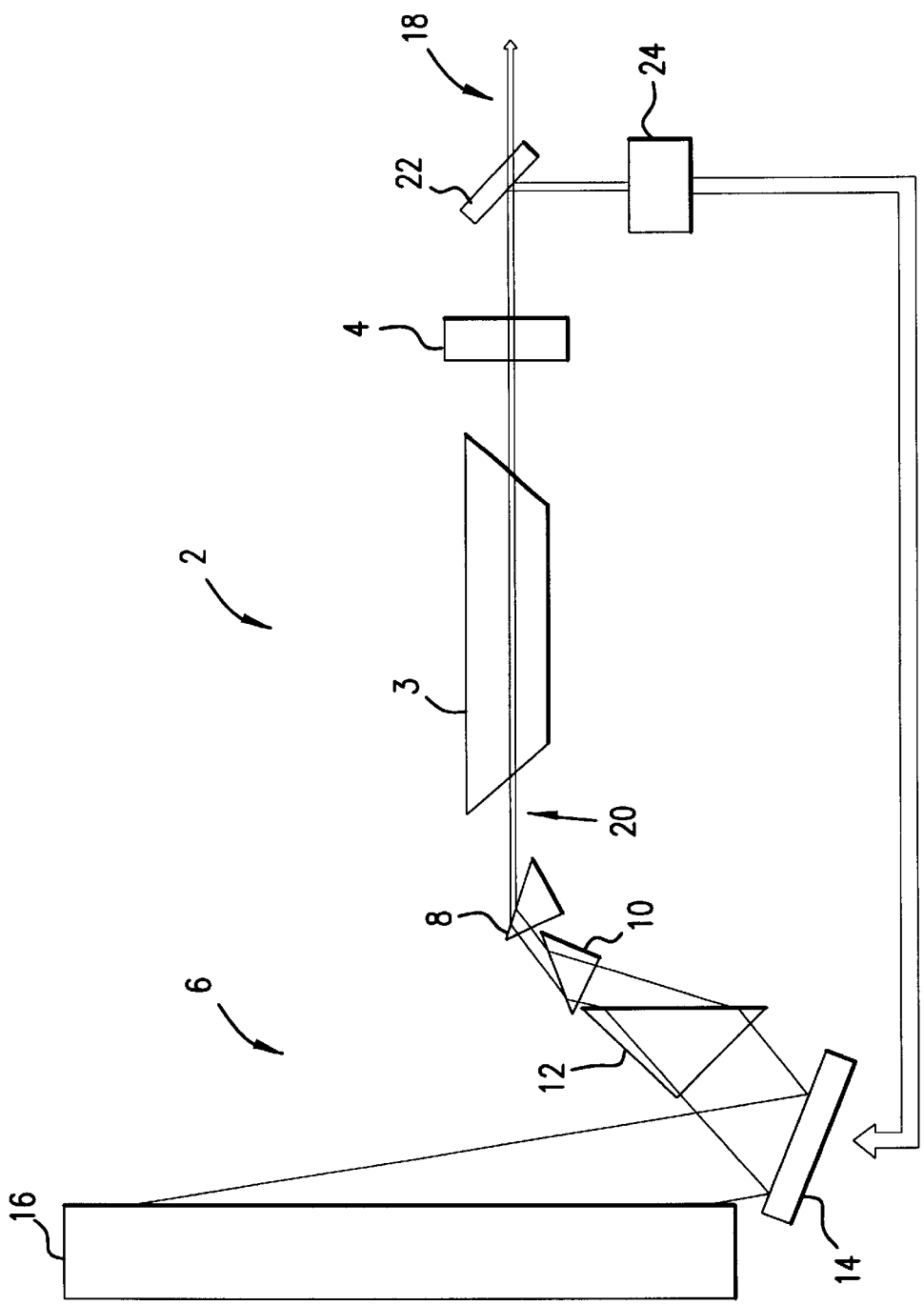
FIG. 1 shows a first prior art narrow band excimer laser.
Figure 2:
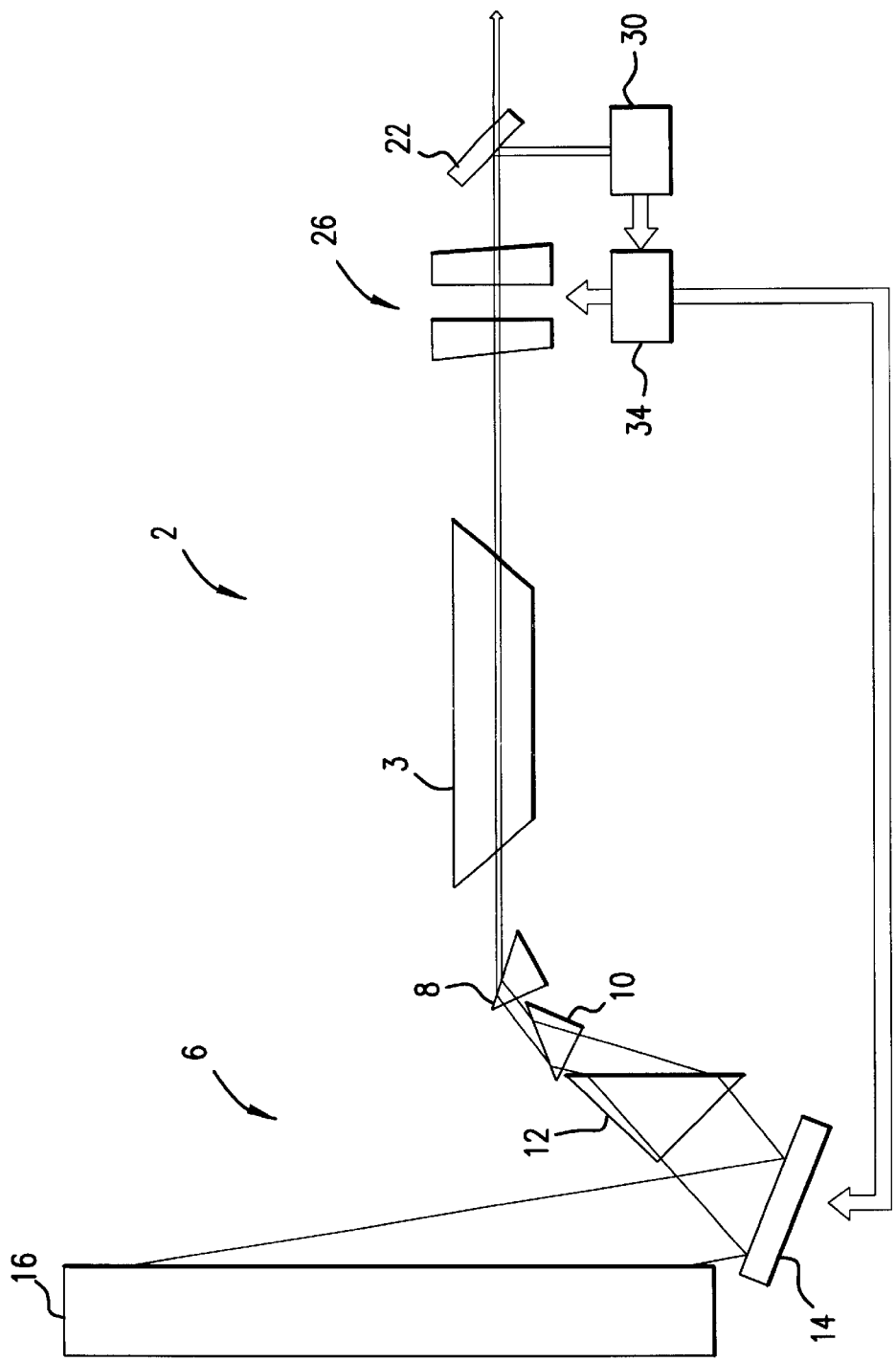
FIG. 2 shows a second prior art narrow band excimer laser.
Figure 4:
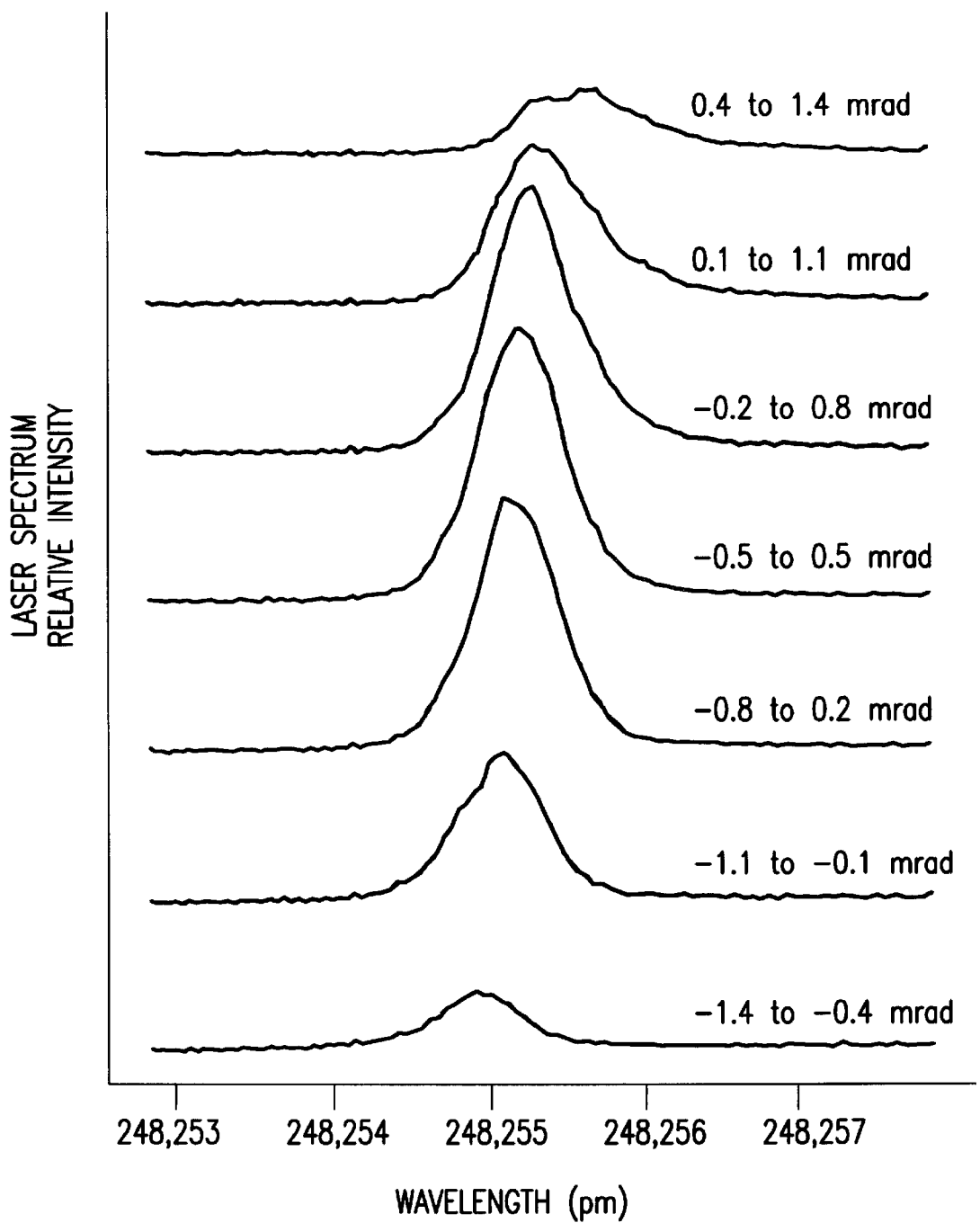
FIG. 4 shows a spectrum of an excimer laser beam filtered with a spatial filter of the present invention.

Because diffraction gratings work by dispersing light at angles depending on the wavelengths of the light in the beam, the spectrum of the light in beams line narrowed with laser systems similar to the FIG. 1 system is normally related to the divergence of the beam. As an example, FIG. 4 shows laser spectrums of a KrF excimer laser measured by Applicant after filtering various diverging portions of the laser beam through a spatial filter. In this experiment, the focal length of each of the two lenses was 50 cm, and the slit width was 0.5 mm. Therefore, the divergence pass band of the spatial filter was about 1 mrad. In this experiment, the slit was shifted in horizontal direction across the beam with steps of 0.15 mm which corresponds to divergence steps of about 0.3 mrad. One can see, that there is a correlation between the spectrum of different portions of the beam and their divergence. While the major part of the beam has spectrum centered near the center, there are portions of the beam which are shifted to either short or long wavelength direction from the center wavelength. These portions of the spectrum carry relative small portion of the total energy, which however is very important for 95% spectral bandwidth measurements which are sensitive to even relatively small spectral components. Because of the lower energy of these "bad" portions of the spectrum, it is possible to use the spatial filter to eliminate these "bad" portions of the spectrum with relative small sacrifice in the total output energy of the beam.

Figure 5:
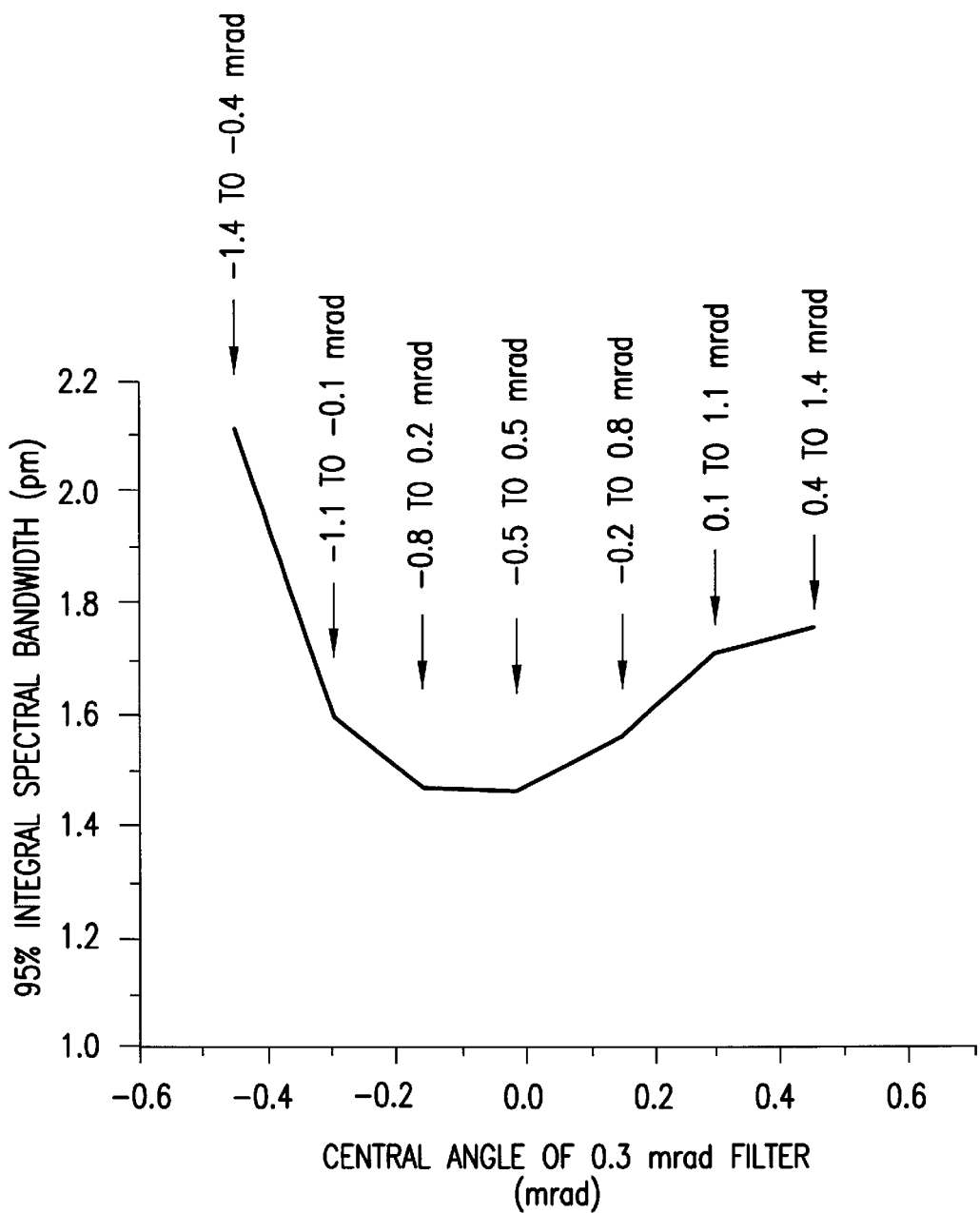
FIG. 5 shows a decrease in 95% integral spectral bandwidth with spatial filtering.
Figure 6:
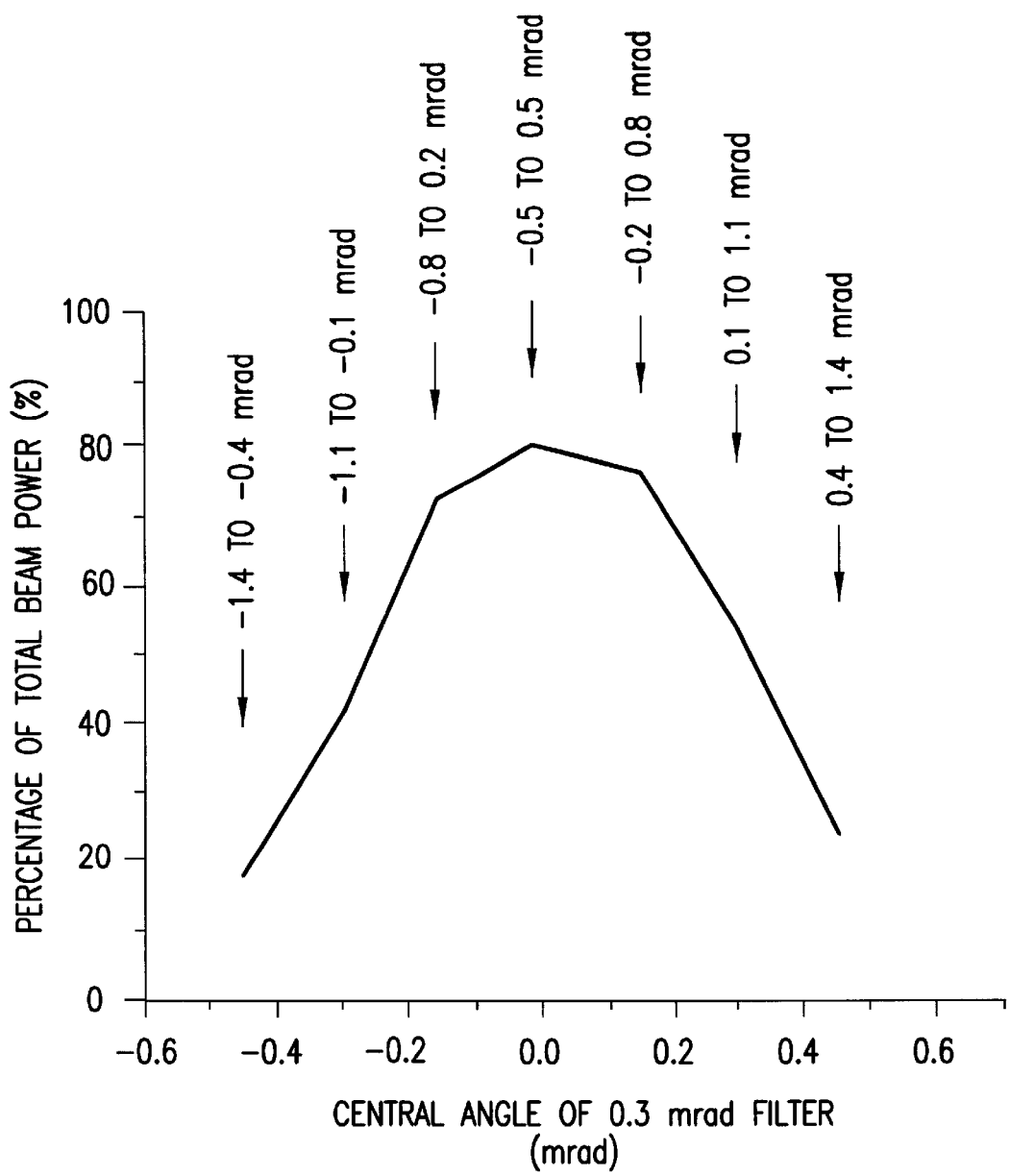
FIG. 6 shows percentage of the total laser beam transmitted through a spatial filter positioned to filter the light at various filter angles.

FIGS. 5 and 6 show the results of experiments conducted by Applicant using a 1.0 mrad spatial filter centered at divergent angles of −0.9, −0.6, −0.3, 0, 0.3, 0.6, and 0.9 milliradians relative to the direction of laser optical axis. FIG. 5 shows the 95% integral measured within the respective angular bands. FIG. 6 shows the percent of the beam energy measured within the respective bands. For example in the 1.0 mrad band between −0.5 mrad and +0.5 mrad, the percentage of beam energy was about 80 percent and the 95 percent integral bandwidth was 1.46 pm. This compares with the unfiltered 95 percent integral bandwidth of 2.00 pm.

Figure 7:
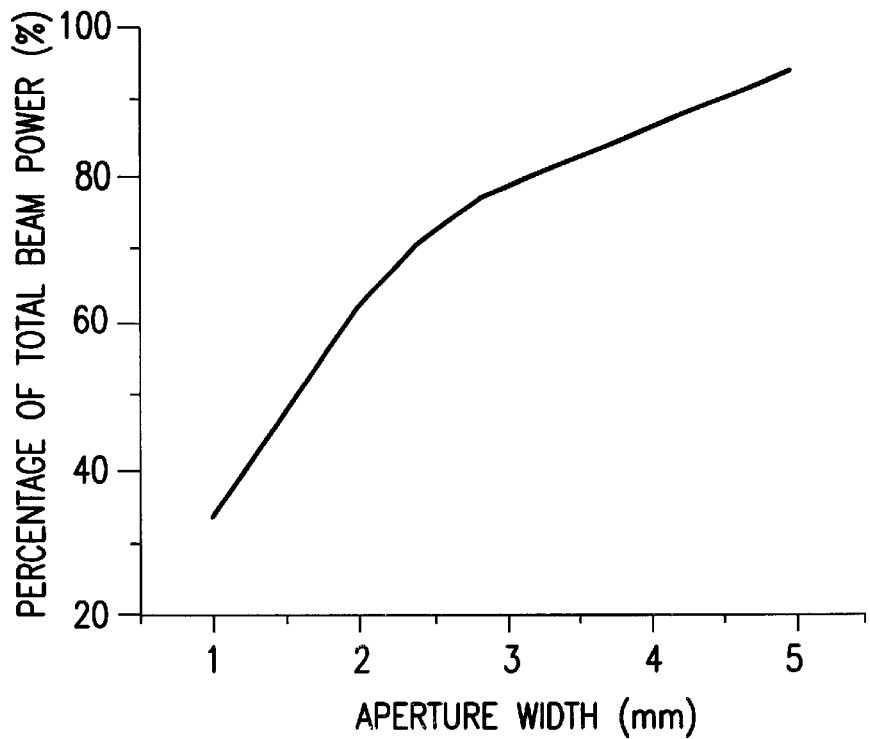
FIG. 7 shows dependence of beam power coming through a vertical slit on the size of that slit.
Figure 8:
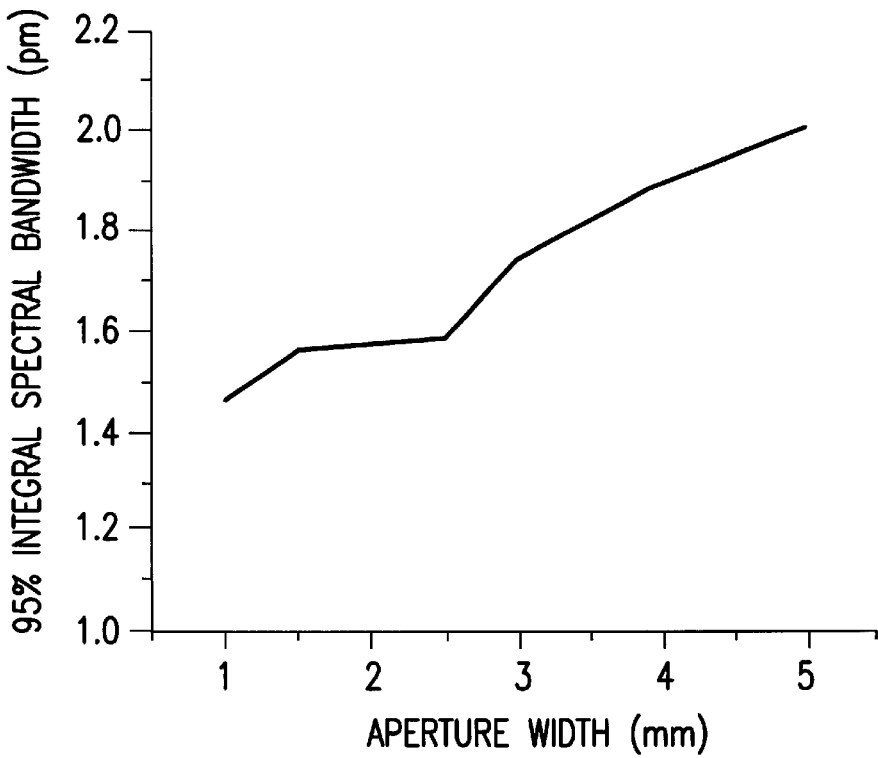
FIG. 8 shows dependence of 95% spectral integral bandwidth on the size of the FIG. 7 slit.

The method of the present invention compares favorably with other techniques, which can be employed to control the bandwidth of excimer laser such as by simply aperturing the outcoming beam. In one well known technique, an aperture is placed in the beam path instead of spatial filter 44, which limits the beam in horizontal direction. FIGS. 7 and 8 show results of experimental measurements done by Applicant. The 95% integral spectral bandwidth of original beam used in these experiments was 2.00 pm. Comparing these data with the ones for the spatial filter of the present invention shows that in order to achieve the same spectral bandwidth of 1.46 pm, it is necessary to use an aperture of about 1 mm wide, which will only transmit about 35% of the original beam energy. In comparison, using the spatial filter of the present invention, more than 80% of original light is preserved.

Figure 9:
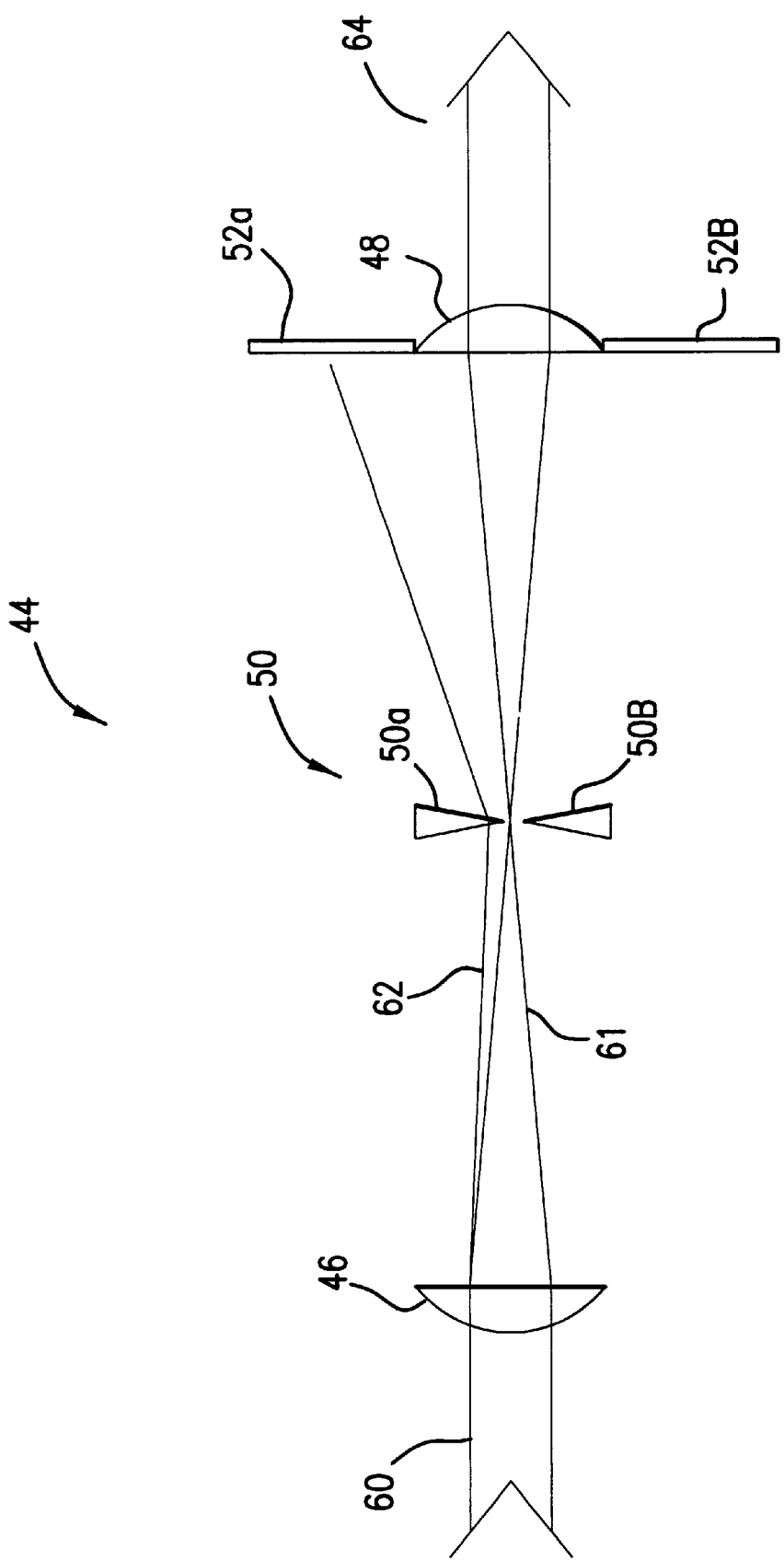
FIG. 9 is a sketch of a preferred spatial filter.

FIG. 9 shows a sketch of a preferred spatial filter 44. Filter 44 consists of two cylindrical lenses 46 and 48 with the cylinder axis oriented vertically (in and out of the drawing plane). The vertical slit 50 consists of two small prisms 50a and 50b with their apex edges separated by a small distance d. The prisms are made from fused silica or other UV transparent material. The distance d can be determined from the equation:

$$d = \alpha / f,$$

where $\alpha$ is desired divergence bandpass of the filter, and $f$ is the focal length of the lens 46. For $f = 200$ mm and $\alpha = 1$ mrad, the required specing d=0.2 mm. Both prisms 50a and 50b are held in place with a mounting means (not shown). The apex angle of the prism is preferably chosen in the range 10–60 degrees. The incoming light 60 is focused by lens 46 in horizontal direction. The portion 61 of the beam which consists of rays having directions which are within 1 mrad of the beam axis will be focused in a narrow line between the prisms 50a and 50b. That means, these rays can go through in between the prisms unaffected. This portion of light is then recollimated by lens 48 into the output beam 64. The portion of the beam 62 which consists of rays having directions which fall outside the 1 mrad range will be focused by lens 46 into either prism 50a or 50b. The prism will deflect the rays away from the axis as shown in FIG. 9. Therefore, these rays will be absorbed by screens 52a and b located on either side of the lens 48. Therefore, only the portion of the beam propagating within a 1.0 mrad fan of angles can go through this filter. The use of UV transparent material instead of opaque metal slit avoids any significant heating or possible laser ablation of the slit material. However, conventional opaque metal slit can be used as well in most situations. This slit will block (absorb and or reflect) any ray 62 whose propagation direction falls outside the selected mrad range.

In addition, UV transparent aperture 50 can be made in the shape other than prism, such as a small radius cylinders with a radius of about 1–2 mm, half moons or others.

Second Preferred Embodiment

Figure 10:
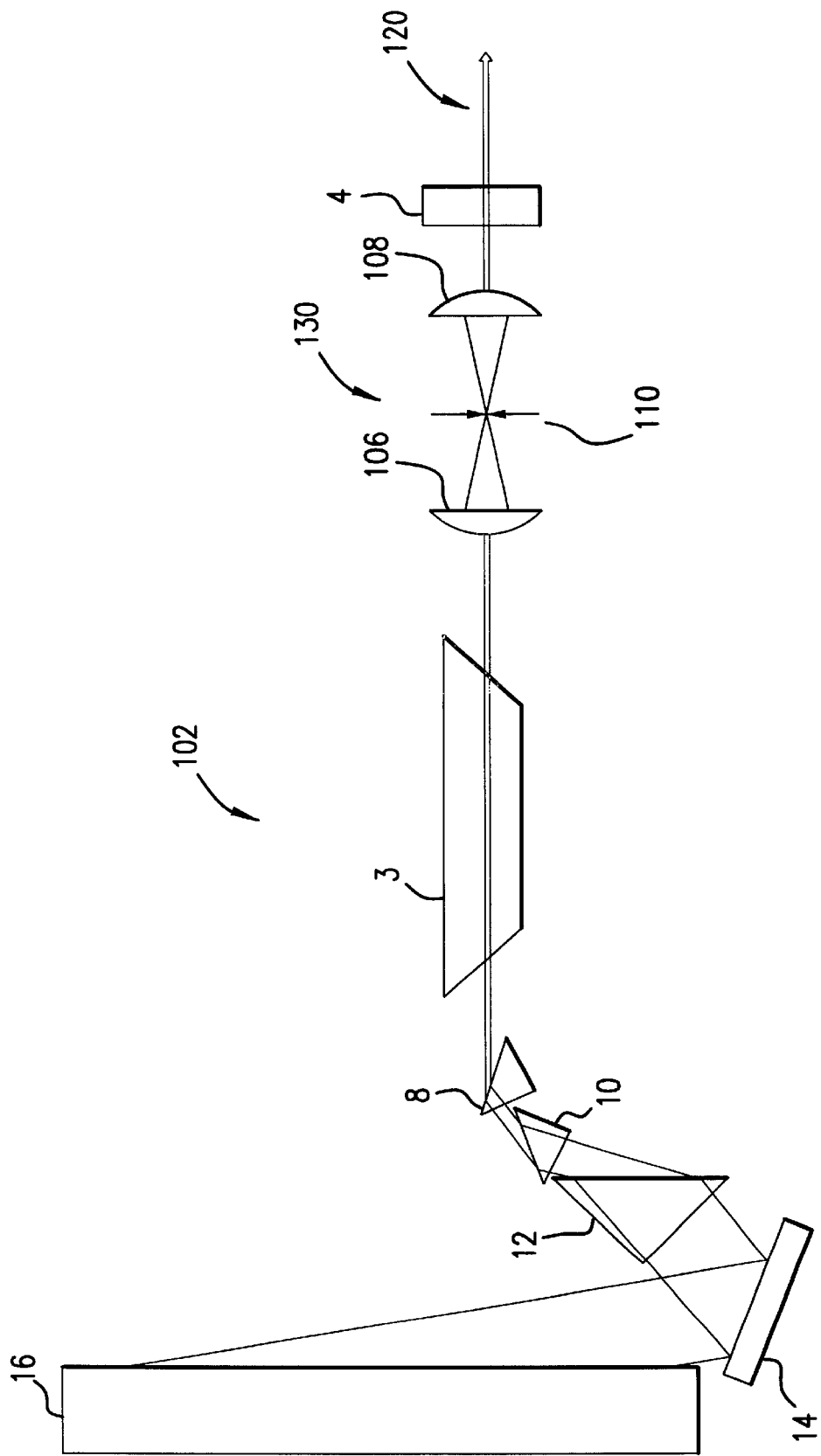
FIG. 10 shows a second preferred embodiment of the present invention.

FIG. 10 shows a second preferred embodiment of the present invention. In this embodiment, the spatial filter 130 is placed inside the optical cavity of laser 102 defined by diffraction grating 16 and output coupler 4. In this embodiment, prisms 8, 10, and 12, mirror 14, and chamber 3 have the same functions as in the first embodiment of FIG. 3. The principles of operation and design of the spatial filter 130 in this embodiment is the same as in the first embodiment of FIG. 3. Placement of the filter inside the laser cavity can provide increased efficiency of the laser operation, because the portions of the beam with a "bad" spectrum will be blocked from even being generated by the laser. Therefore, they will not unnecessary drain the laser gain, which can be used instead to increase production of "good" spectrum, that is the one, which has a divergence within defined angle, such as 1 mrad, and reduced spectrum bandwidth. The addition of the spatial filter 130 inside the laser cavity, however, will increase the total length of the cavity, which can possibly adversely affect the efficiency of the laser.

Although this invention has been described in detail with reference to specific preferred embodiment, the reader should understand that many variations of the above embodiments are possible. For example, spherical focusing lenses can be used instead of cylindrical lenses. More complex telescopic lens structure can be used in place of a single lens which was specified. The grating based line narrowing package could be replaced with a prism based line narrowing package, since prisms, like gratings disperse the rays of a beam according to the wavelengths of light in the beam. A good application for a system using prism based line narrowing with spatial filtering is for an $F_2$ laser. The laser gas in a typical $F_2$ laser comprises a small portion of fluorine gas and the remainder helium or neon. Therefore the reader should understand that the scope of the invention should be determined by the appended claims and their legal equivalents.

That which is claimed is:

1. A line narrowed gas discharge laser having an output beam defining a bandwidth comprising:
   A) a gain medium, comprising a discharge excited laser gas, for generating a laser beam;
   B) line narrowing optics comprising a diffraction grating based dispersive element defining a dispersion direction for dispersing into wavelength dependent directions laser light produced in said gain medium,
   C) a spatial filter comprising an aperture positioned to define an aperture position, and at least two focusing elements each having a focus at said aperture position; wherein said spatial filter is aligned in said laser beam so as to filter out of said laser beam light at wavelengths greater or smaller than a desired range of wavelengths, wherein said spatial filter substantially reduces the bandwidth of the output beam, and wherein said aperture comprises two prisms transparent to said laser beam and said aperture is a rectangular slit in a material opaque to said beam.

2. A laser as in claim 1 wherein at least one of said two focusing elements is a cylindrical lens defining an axis having its axis aligned perpendicular to said dispersion direction.

3. A laser as in claim 1 wherein said at least two focusing elements are two cylindrical lenses, each lens defining an axis and having its axis aligned perpendicular to said dispersion direction.

4. A laser system as in claim 1 wherein said system comprises optical elements defining a resonance cavity and said spatial filter is located outside said resonance cavity.

5. A laser system as in claim 1 wherein said system comprises optical elements defining a resonance cavity and said spatial filter is located inside said resonance cavity.

6. A laser as in claim 1 wherein said dispersive element in a grating.

7. A laser as in claim 1 wherein said grating is arranged in a Littrow configuration.

8. A laser as in claim 1 wherein said line narrowing optics comprises a beam expander.

9. A laser as in claim 8 wherein said beam expander comprises a plurality of prisms.

10. A line narrowed gas discharge laser having an output beam defining a bandwidth comprising:
    A) a gain medium, comprising a discharge excited laser gas, for generating a laser beam;
    B) line narrowing optics comprising a prism based dispersive element defining a dispersion direction for dispersing into wavelength dependent directions laser light produced in said gain medium,
    C) a spatial filter comprising an aperture positioned to define an aperture position, and at least two focusing elements each having a focus at said aperture position; wherein said spatial filter is aligned in said laser beam so as to filter out of said laser beam light at wavelengths greater or smaller than a desired range of wavelengths, wherein said spatial filter substantially reduces the bandwidth of the output beam, and wherein said aperture comprises two prisms transparent to said laser beam and said aperture is a rectangular slit in a material opaque to said beam.

11. A laser as in claim 10 wherein said laser is an $F_2$ laser.

12. A laser as in claim 11 wherein said laser gas comprises fluorine and helium or neon.

* * * * *